United States Patent [19]

Moslehi

[11] Patent Number: 5,446,824
[45] Date of Patent: Aug. 29, 1995

[54] LAMP-HEATED CHUCK FOR UNIFORM WAFER PROCESSING

[75] Inventor: Mehrdad M. Moslehi, Dallas, Tex.

[73] Assignee: Texas Instruments, Dallas, Tex.

[21] Appl. No.: 63,110

[22] Filed: May 17, 1993

Related U.S. Application Data

[63] Continuation of Ser. No. 774,677, Oct. 11, 1991, abandoned.

[51] Int. Cl.⁶ .................. H05B 3/00; H01L 21/027; F27D 11/00
[52] U.S. Cl. .................. 392/416; 118/724; 118/50.1
[58] Field of Search .................. 392/416–418; 219/405, 411, 390; 118/724, 725, 728, 730, 50.1; 250/492.1; 427/55, 50, 51, 585, 586, 592, 557, 569

[56] References Cited

U.S. PATENT DOCUMENTS

| 3,836,751 | 9/1974 | Anderson | 219/405 |
|---|---|---|---|
| 4,499,354 | 2/1985 | Hill et al. | 118/725 |
| 4,599,069 | 7/1986 | Murakami et al. | 118/725 |
| 4,640,224 | 2/1987 | Bunch et al. | 118/725 |
| 4,682,566 | 7/1987 | Aitken | 118/724 |
| 4,709,655 | 12/1987 | Van Mastrigt | 118/725 |
| 4,796,562 | 1/1989 | Brors et al. | 118/725 |
| 4,891,335 | 1/1990 | McNeilly | 219/530 |
| 5,073,698 | 12/1991 | Stultz | 219/405 |
| 5,119,761 | 6/1992 | Nakata | 118/725 |
| 5,156,461 | 10/1992 | Moslehi et al. | 374/121 |
| 5,255,286 | 10/1993 | Moslehi et al. | 374/121 |
| 5,293,216 | 3/1994 | Moslehi | 356/371 |

FOREIGN PATENT DOCUMENTS

| 60-189924 | 9/1985 | Japan | 118/724 |
|---|---|---|---|
| 60-189927 | 9/1985 | Japan | 118/730 |
| 63-58926 | 3/1988 | Japan | |
| 63-160222 | 7/1988 | Japan | |
| 64-5014 | 1/1989 | Japan | 392/418 |
| 3-20464 | 1/1991 | Japan | 118/724 |
| 3-159224 | 7/1991 | Japan | |
| 3-256323 | 11/1991 | Japan | |
| 4-17667 | 1/1992 | Japan | |

*Primary Examiner*—John A. Jeffery
*Attorney, Agent, or Firm*—Gary Honeycutt; Renie' Grossman; Richard Donaldson

[57] ABSTRACT

A chuck (82) for lamp-heated thermal and plasma semiconductor wafer (38) processing comprises an absorbing surface (171) for absorbing optical energy from an illuminator module (84) that transforms the electrical energy into radiant optical energy. Chuck (82) includes an absorbing surface (171) that absorbs optical energy and distributes the resultant thermal energy. From the absorbing surface, a contact surface (168) conducts the heat energy to semiconductor wafer (38) and uniformly heats the semiconductor wafer (38) with the distributed thermal energy. Chuck (82) not only provides significantly improved process temperature uniformity, but also allows for the generation of RF plasma for plasma-enhanced fabrication processes as well as for in-situ chamber cleaning and etching. Additionally, chuck (82) provides at least two methods of determining semiconductor wafer temperature; a direct reading thermocouple (112) and association with the pyrometry sensor of illuminator module (84). Other features of chuck (82) are that it is thermally decoupled from the thermal mass of fabrication reactor (50) and establishes an environment for purging optical quartz window (80) surface and semiconductor wafer (38) backside in order to prevent deposition on wafer backside and the quartz window.

5 Claims, 8 Drawing Sheets

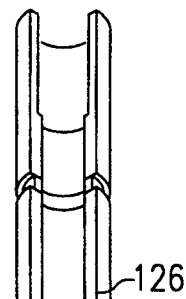
FIG. 10
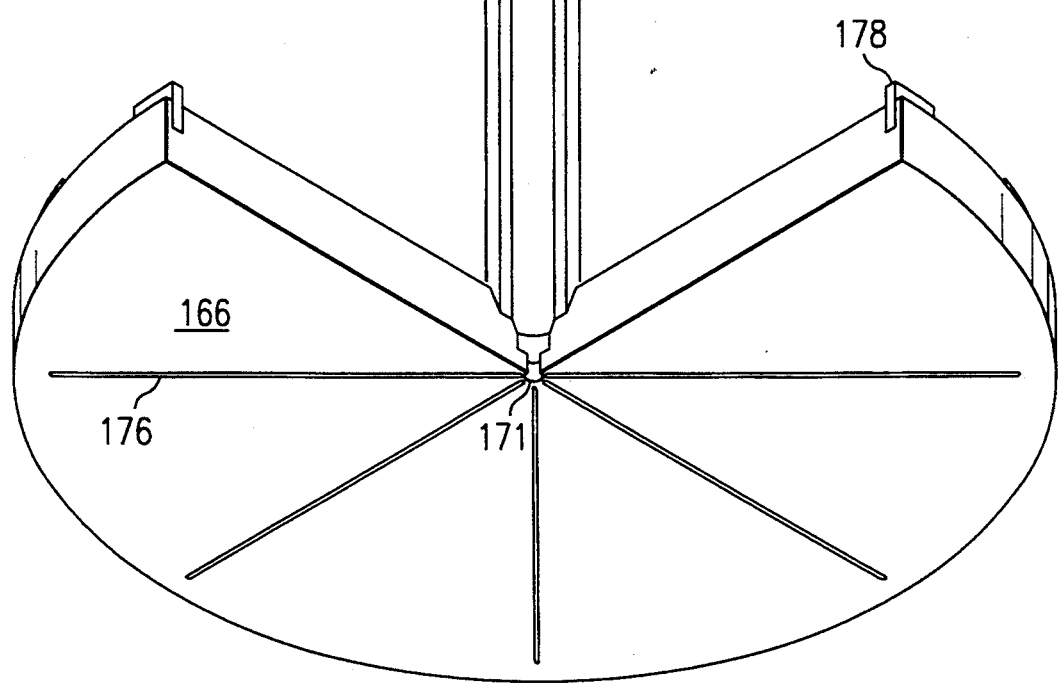

LAMP-HEATED CHUCK FOR UNIFORM WAFER PROCESSING

This application is a continuation of application Ser. No. 07/774,677, filed Oct. 11, 1991, now abandoned.

TECHNICAL FIELD OF THE INVENTION

The present invention relates to microelectronic device processing and more particularly to a lamp-heated chuck with the ability to provide radio-frequency (RF) plasma enhancement for uniform semiconductor wafer processing that is useful in a wide range of single-wafer lamp-heated and RF plasma device processing applications.

BACKGROUND OF THE INVENTION

Single-wafer rapid thermal processing (RTP) is a versatile technique for fabrication of very-large-scale integrated (VLSI) and ultra-large-scale integrated (ULSI) circuits. Single-wafer RTP combines low thermal mass, photon-assisted, rapid wafer heating with reactive ambient semiconductor device processing. Both the wafer temperature and the process environment can be quickly controlled and, as a result, it is possible to optimize each fabrication step to improve the overall electrical performance of the circuits.

RTP is one form of single-wafer semiconductor wafer processing that can provide improved wafer-to-wafer process repeatability in single-wafer, lamp-heated, thermal processing reactors. Numerous semiconductor fabrication technologies may use RTP techniques, including thermal oxidation, nitridation, implant activation, dopant diffusion, and different types of thermal anneals. Chemical-vapor deposition (CVD) is another type of device fabrication process that can benefit from RTP in single-wafer reactors. For example, CVD processes using advanced RTP techniques to form dielectrics (e.g., oxides and nitrides), semiconductors (e.g., amorphous silicon and polysilicon), and conductors (e.g., aluminum, copper, tungsten, and titanium nitride) have significant potentials in VLSI and ULSI device fabrication.

FIG. 1 illustrates a known RTP system 20 for semiconductor wafer processing. The system 20 of FIG. 1 uses two banks 22 and 24 of lamps 26 which are arranged in orthagonal or cross directions. The lamps are placed outside the reactor chamber's quartz windows 30. Reflectors 32 and 34 are placed behind lamp banks 22 and 24, respectively. Quartz susceptor 36 holds semiconductor wafer 38, and semiconductor wafer 38 front and back surfaces face lamp banks 22 and 24. Relative power to each lamp 26 may be set and overall power may be controlled to maintain desired temperature by computer lamp controller 40. Computer lamp controller 40 receives temperature signal input from pyrometer 42. Rotary pump 44 vacuum manifold and gas manifold 46 maintain process chamber environment 28 for various processes.

The conventional type of RTP system such as that of FIG. 1, may provide generally uniform wafer heating during some steady-state conditions. However, the known RTP systems cannot provide uniform wafer heating over a wide range of temperatures and during both the transient and steady-state conditions. The resultant wafer temperature nonuniformities can result in process nonuniformities and possibly slip dislocations. In fact, the most critical problems with commercial RTP systems are process nonuniformities caused by the steady-state and transient temperature nonuniformities.

Some existing tungsten-halogen lamp-heated RTP systems such as that of the FIG. 1, employ two crossed banks of linear tungsten-halogen lamps. While this configuration may provide a limited capability for steady-state temperature uniformity control, it does not provide complete uniformity adjustment and does not provide cylindrical symmetry consistent with the circular shape of semiconductor wafer 38. Moreover, the design of FIG. 1 provides no reliable and accurate measure of wafer 38 temperature. In addition, this type of RTP system does not provide any RF plasma capability for in-situ plasma processing applications.

The RTP temperature control and process nonuniformity problems are particularly manifested in the form of localized wafer edge cooling due to excessive heat losses by radiation and gas cooling. FIG. 2 shows a qualitative plot of wafer temperature versus radial position that demonstrates the edge problem. In FIG. 2, the vertical axis represents wafer temperature and the horizontal axis has an origin at the center C and range in equal directions between $-R$ and $+R$ at the edge points of semiconductor wafer 38. According to FIG. 2, at the center C, semiconductor wafer 38 may achieve a temperature $T_c$. Throughout a significant portion of the radial distance from C to the edge of semiconductor wafer 38, the temperature can be made approximately equal to $T_c$. Close to the edge, however, the temperature usually drops. The arc labeled "edge cooling" indicates that at the $-R$ and $+R$ edge points on semiconductor wafer 38, semiconductor wafer 38 temperature falls to the edge cooled level of $T_e$. The amount of center-to-edge temperature variation may be a few degrees up to 10's of degrees C.

The extent of the temperature nonuniformity problem depends on the target wafer temperature and the RTP system design as well as process parameters such as chamber pressure. For a given RTP lamp, the wafer temperature nonuniformity may also depend on the details of the thermal cycle. The transient thermal nonuniformity is, in general, different from the steady-state temperature nonuniformity. If the lamp module for heating semiconductor wafer employs a single high-power arc lamp, there is basically no flexibility for real-time control or optimization of wafer temperature uniformity by changing or adjusting the optical flux distribution on the wafer. In commercial RTP systems with tungsten-halogen lamps such as that in FIG. 1, there is no practical way to adjustably control the transient and steady-state temperature uniformity profiles over the entire wafer area. High-temperature RTP techniques particularly exacerbate this problem. For example, in some applications fabrication temperatures may reach as high as 1100° C. and good wafer temperature uniformity is required in order to avoid slip dislocations and process nonuniformities.

Another semiconductor device fabrication technique that has many applications is known as "plasma-enhanced processing." In plasma-enhanced processing, a substantially ionized gas, usually produced by a radio-frequency (RF) or microwave electromagnetic gas discharge, generates a mixture of ions, electrons, and excited neutral species, which may react to deposit or etch various material layers on semiconductor substrates in a wafer processing reactor. Plasma-enhanced chemical-vapor deposition (PECVD) is an example of a widely-used plasma-enhanced semiconductor device fabrication process. PECVD uses the activated neutrals and ions in the plasma to deposit material layers at high rates and lower temperatures on a semiconductor substrate.

Various PECVD applications for plasma-enhanced processing and semiconductor device manufacturing include deposition of amorphous silicon, polysilicon, tungsten, aluminum, and dielectric layers. Plasma-enhanced metal-organic chemical-vapor deposition processes (PEMOCVD) also are useful for high-rate deposition of material layers such as aluminum and copper films for device interconnection applications. Plasma-enhanced deposition techniques can also be used for planarized interlevel dielectric formation. Additional applications of PECVD techniques include low-temperature epitaxial silicon growth as well as diamond thin films.

If it were possible to concurrently and/or sequentially perform plasma-enhanced processing together with lamp-heated processing (RTP) in the same chamber without having to reconfigure the fabrication reactor, numerous semiconductor device fabrication processes could be materially enhanced. For example, such a system would provide for rapid thermal chemical-vapor deposition (RTCVD) of various material layers with in-situ process chamber cleaning. There is no known RTP system that accomplishes these objectives in a flexible manner.

As a result of the above, there is a need for a method and apparatus to provide both steady-state and transient semiconductor device fabrication process uniformity for rapid thermal processing (RTP) applications.

There is a need for a device that permits accurate real-time measurement of temperature across the entire semiconductor wafer.

There is a need for a method and apparatus that allows semiconductor device fabrication process control flexibility based on the particular application as well as real-time temperature readings of the semiconductor wafer temperature and its uniformity.

Moreover, there is a need for a semiconductor device fabrication apparatus that permits flexible and uniform wafer processing for various thermal processing applications.

There is yet the need for an apparatus for plasma generation within the semiconductor wafer processing chamber that is both reliable and controllable.

There is the further need for a method and apparatus to support coordinated plasma generation for plasmaenhanced semiconductor device fabrication processes and lamp-heated rapid thermal processes.

SUMMARY OF THE INVENTION

Accordingly, the present invention provides a lamp-heated radio-frequency (RF) plasma chuck for uniform semiconductor device processing which overcomes the problems and satisfies the needs previously considered.

According to one aspect of the present invention, there is provided a chuck for lamp-heated and (RF) plasma-enhanced semiconductor wafer processing that comprises an absorbing surface for absorbing optical energy from a heating lamp via an optically transparent window and transforming the optical energy into radiant heat energy. The main body of the radio-frequency chuck associates with the absorbing surface and distributes the radiant heat energy and conducts the thermal energy toward the semiconductor wafer. A contact surface of the chuck associates with the main body of the chuck and transfers the distributed radiant heat energy across the entire semiconductor wafer surface. In the preferred embodiment, the new chuck design provides a circular thin silicon carbide or a silicon-carbide-coated graphite (other materials such as silicon may also be used) disk for absorbing the optical energy from a multi-zone heat lamp via an optically transparent window made of quartz, sapphire, or another material. The silicon carbide or graphite disk transforms the optical energy from the multi-zone heating lamp into radiant heat energy and conducts the radiant heat energy to a circular and somewhat thicker (higher thermal mass) metallic disk or main chuck body that significantly distributes the radiant heat energy within its volume. The base or main body of the chuck has a surface which contacts the semiconductor wafer and distributes the radiant heat energy to the semiconductor wafer. As a result, the chuck of the present invention uniformly heats the semiconductor wafer from its backside and avoids the edge nonuniformity or cooling problem typical of known RTP-based semiconductor device fabrication equipment.

A technical advantage of the present invention is that it is designed to be compatible with the high-performance multi-zone heat lamp for semiconductor wafer processing of U.S. patent application, Ser. No. 07/690,426 (filed on Apr. 24, 1991) by Moslehi, et. al. and assigned to Texas Instruments Incorporated now abandoned. The device of that invention provides much improved steady-state and transient semiconductor device fabrication uniformity and facilitates the use of advanced multi-point pyrometry techniques for semiconductor wafer temperature measurement. Moreover, the high-performance multi-zone heating lamp provides significantly increased semiconductor fabrication process uniformity control flexibility. For lamp-heated semiconductor device processing, the chuck of the present invention combines with the multi-zone heat lamp to further enhance both steady-state and transient temperature and process uniformity.

Another technical advantage of the present invention is that it provides a way to perform more accurate and convenient pyrometry-based semiconductor wafer temperature measurements by measuring the temperature of the surface that absorbs the optical energy from the lamp. As a result, the temperature of the absorbing surface (with a known constant emissivity) may be measured and controlled during a semiconductor device fabrication process. A direct relationship exists between the temperature of the semiconductor wafer and the temperature of the absorbing surface during wafer processing. With a known absorbing surface emissivity for a particular temperature range and a known temperature offset relationship between the optical energy absorbing surface (e.g., the silicon carbide or graphite disk in the preferred embodiment) and the wafer, it is possible to accurately measure and control the temperature of the semiconductor wafer.

Another technical advantage of the present invention is that it provides increased process control flexibility over known systems. For example, not only is the chuck of the present invention fully compatible with the multi-zone illuminator of U.S. patent application Ser. No. 07/690,426, now abandoned but also the present invention has further flexibility features. The chuck of the present invention is designed to be thermally decoupled from the thermal mass of the semiconductor device fabrication reactor including the optical/vacuum quartz window. This permits more rapid and more uniform temperature response for various RTP techniques. Moreover, thermal isolation of the chuck from the optical/vacuum quartz window eliminates possible degradation of the vacuum O-ring seals. Additionally, the present invention has an embedded thermocouple for direct wafer temperature measurement that may be used to calibrate the pyrometry measurement devices or to separately sense the temperature of the semiconductor wafer for real-time temperature and process control. Furthermore, the chuck of the present invention may be designed for fabrication reactors that process either 150 millimeter or 200 millimeter and even larger semiconductor wafers. The radial symmetry of the chuck of the present invention facilitates scaling in size with uniform temperature distribution.

Another technical advantage of the present invention is that it may be manufactured of high-temperature refractory metals or their alloys which may be used at increased processing temperatures. For example, in the preferred embodiment, applications may be as high as 1100° C. Moreover, the preferred embodiment includes a melted (liquid metal) tin chamber that further promotes a uniform distribution of the wafer temperature. In high-temperature processing applications, the chuck of the present invention has the ability to rapidly distribute the radiant heat energy for uniform wafer heating. This feature of the chuck also ensures uniform processing at lower temperatures.

Yet another important technical advantage of the present invention is that it permits the combination of lamp-heated semiconductor wafer processing with RF plasma generation. The chuck of the present invention includes an RF source contact which translates radio-frequency excitation signals from an external electrical source to the processing environment of the semiconductor wafer. No known device provides the combination of RF generation for plasma enhancement and improved thermal uniformity as provided in the present invention via multi-zone lamp heating.

BRIEF DESCRIPTION OF THE DRAWINGS

The invention and its modes of use and advantages are best understood by reference to the following description of illustrative embodiments when read in conjunction with the accompanying drawings, wherein:

FIG. 10 is a schematic cross-sectional view of an alternative embodiment of the base of the chuck.

DETAILED DESCRIPTION OF THE INVENTION

The preferred embodiment of the present invention is best understood by referring to the FIGURES wherein like numbers are used for like and corresponding parts of the various documents.

Figure 1:
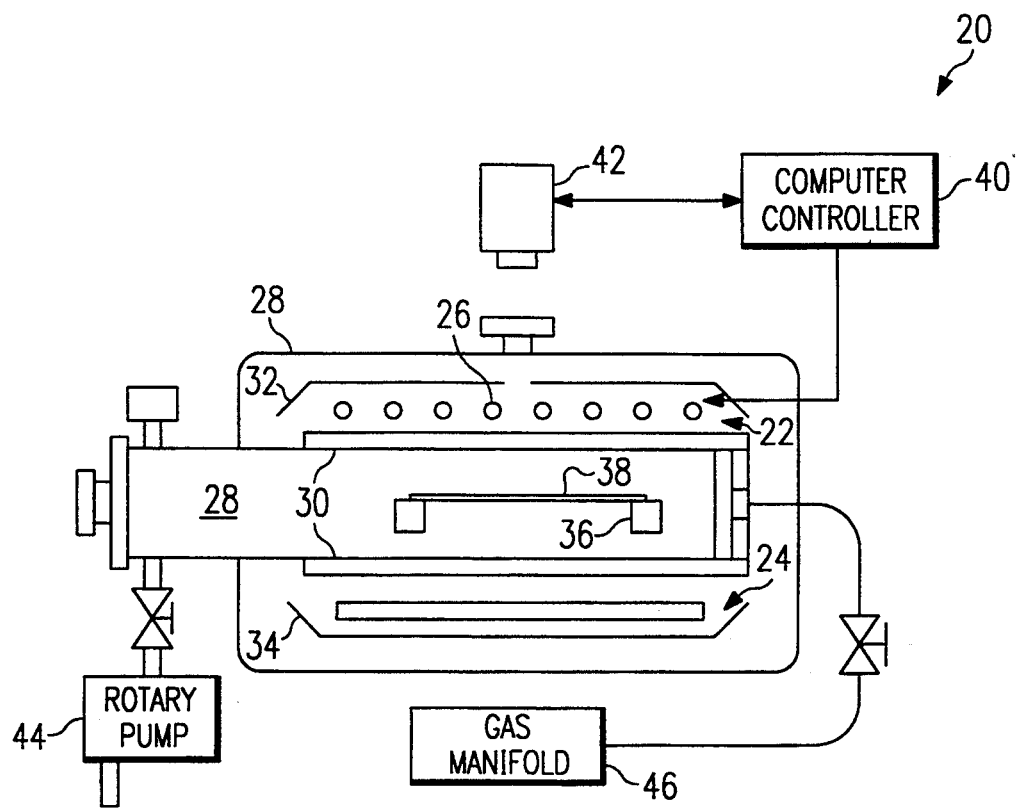
FIG. 1 is a side schematic view of a tungsten-halogen lamp RTP system typical of the prior art.
Figure 2:
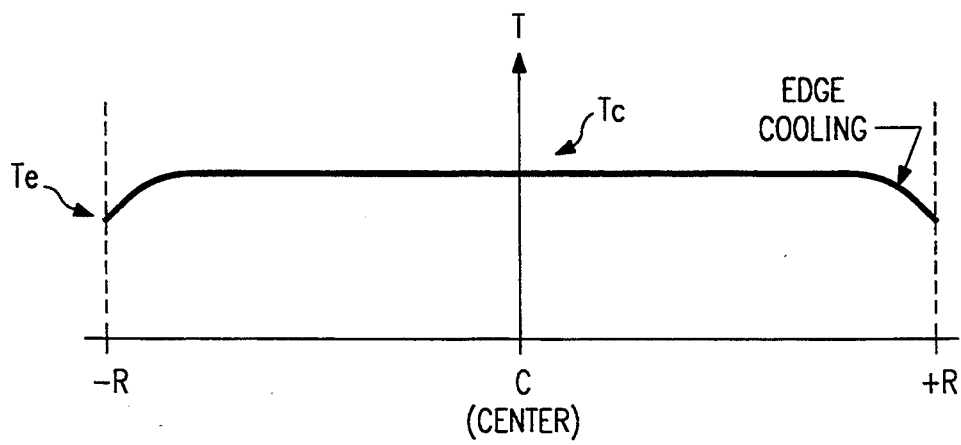
FIG. 2 illustrates the wafer temperature nonuniformity problem that the present invention solves.
Figure 3:
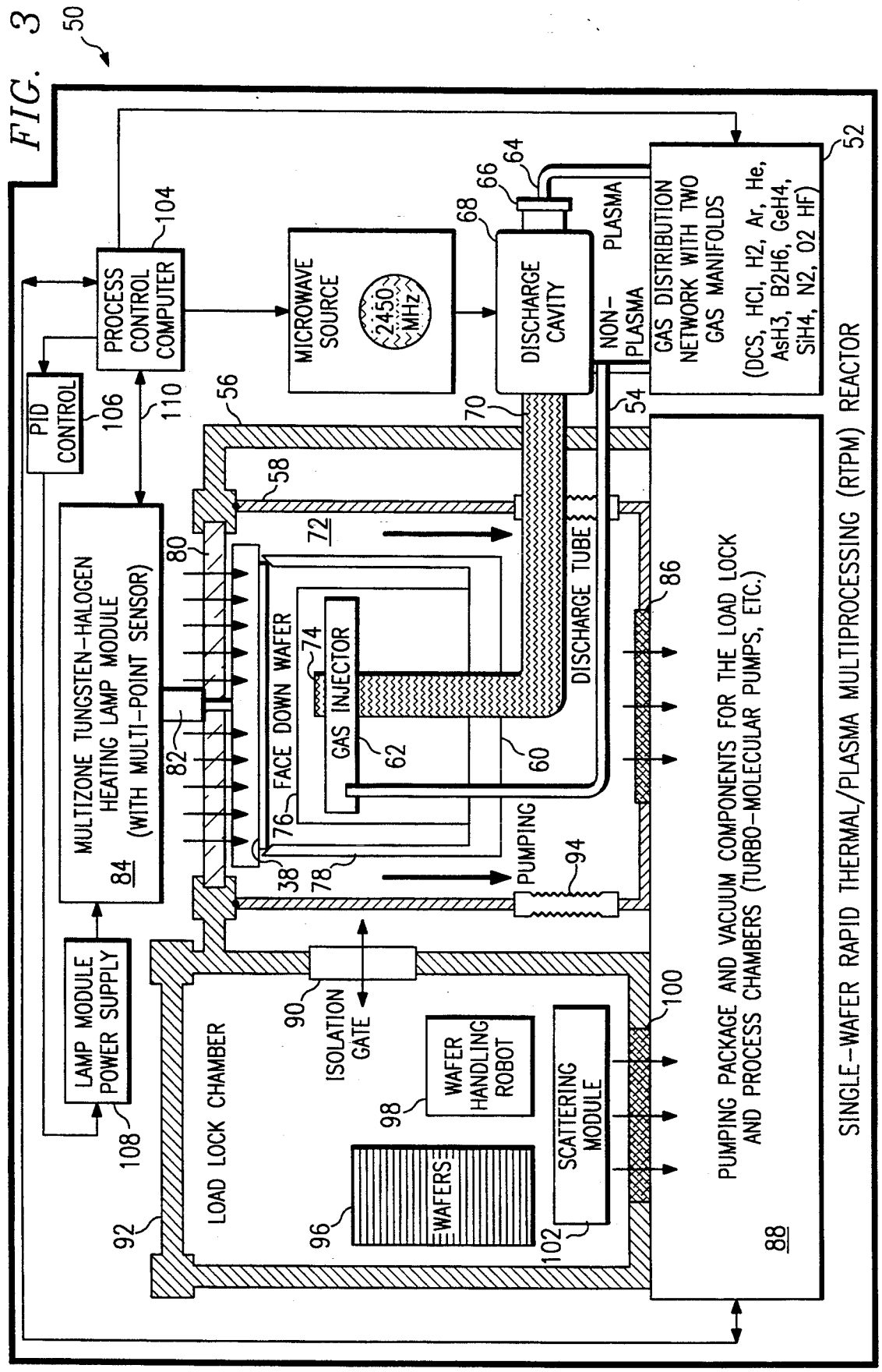
FIG. 3 is a schematic cut-away side view of a typical environment of the preferred embodiment.
Figure 4:
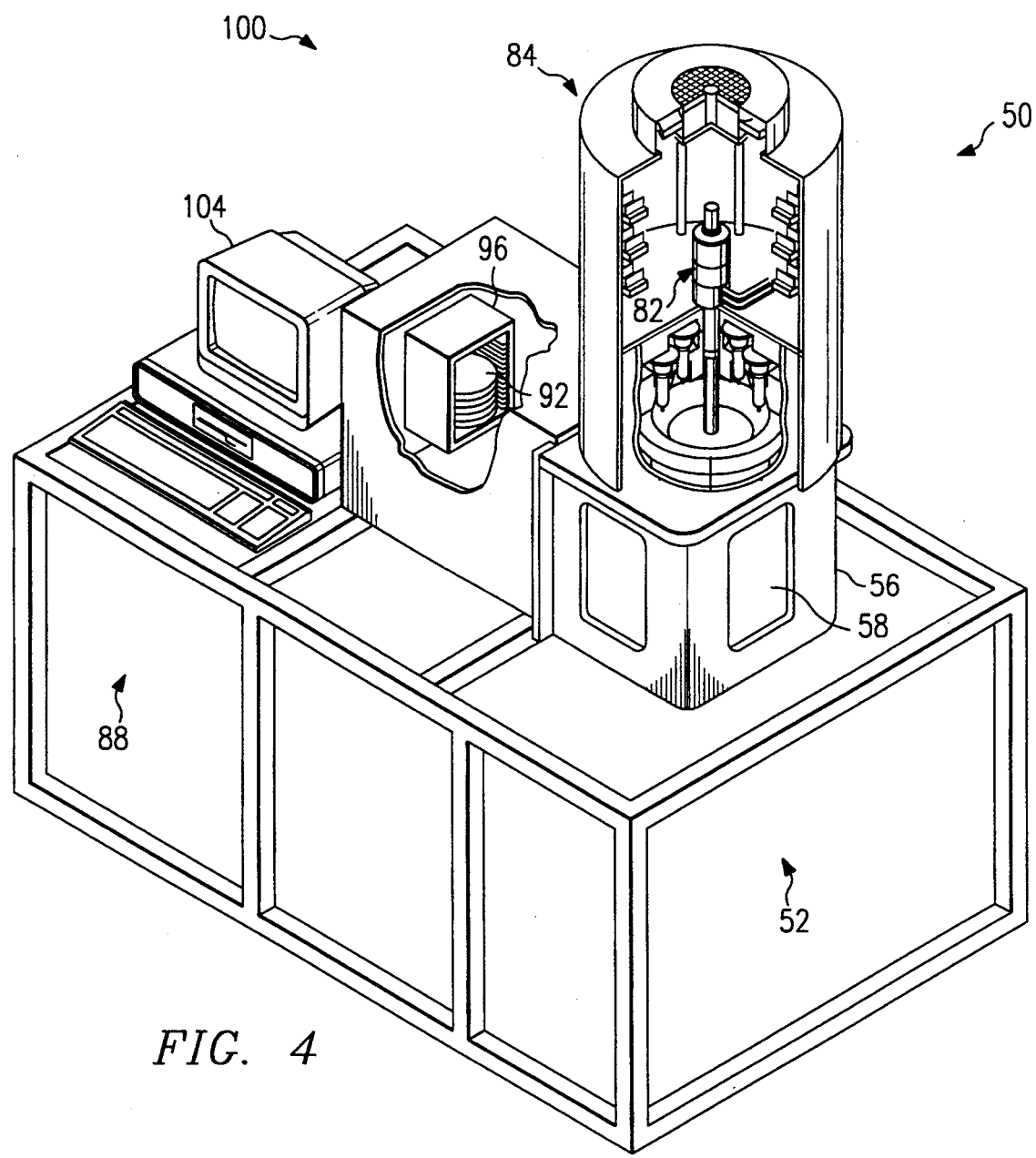
FIG. 4 is a partially cut-away isometric view of a single-wafer rapid thermal processing reactor for establishing the environment of the preferred embodiment.

FIG. 3 is a schematic representation and FIG. 4 is an isometric partially cut-away view of a single-wafer semiconductor fabrication reactor 50 that establishes the environment of the present invention. Referring to FIG. 3, within a single-wafer rapid thermal processing (RTP) reactor 50 such as the Texas Instruments Automated Vacuum Processor (AVP), may reside semiconductor wafer 38. Beginning at the bottom right hand corner of FIG. 3, gas distribution network 52 may comprise two gas manifolds: a non-plasma process gas manifold and a plasma manifold. The non-plasma gas manifold feeds through gas line 54 into reactor casing 56 and process chamber wall 58 to ground electrode 60 and into gas injector 62. The plasma manifold connects through plasma line 64 through connection 66 and into microwave discharge cavity 68. Plasma from microwave discharge cavity 68 feeds through plasma tube 70 which also penetrates reactor casing 56 and process chamber wall 58. Within the process chamber 72 plasma tube 70 passes through ground electrode 60 and through gas injector 62 to plasma output 74. Above quartz jacket assembly 76 and supported by low thermal mass pins 78 appears semiconductor wafer 38. Low thermal mass pins 78 are clamped against chuck assembly 82 by ground electrode 60 (or a liner, not shown) within process chamber 72.

Process chamber 72 includes optical quartz window 80 through which penetrates the chuck assembly 82 of the present invention. Chuck assembly 82 holds firmly semiconductor wafer 38 for direct thermal contact and heat distribution across semiconductor wafer 38. RF chuck assembly 82 connects to tungsten-halogen heating lamp module 84 and receives direct optical energy from module 84 through quartz window 80. In association with tungsten-halogen heating lamp module 84 may be a multi-point temperature sensor (not shown) as described in U.S. patent application Ser. No. 702,646 by Moslehi, et al. filed on May 17, 1991 and assigned to Texas Instruments Incorporated now issued as U.S. Pat. Nos. 5,156,461 and U.S. 5,255,286. Vacuum pump connection 86 removes flowing process gas and plasma from process chamber 72 and directs them into pumping package 88. Additionally, isolation gate 90 permits passage of semiconductor wafer 38 from vacuum load-lock chamber 92 into process chamber 72. To permit movement of semiconductor wafer 38 into process chamber 72, a vertically moveable bellows 94 supports process chamber wall 58.

Within vacuum load-lock chamber 92 appears cassette 96 of semiconductor wafers 38 from which wafer handling robot 98 removes a single semiconductor wafer 38 for processing. To maintain load-lock chamber 92 under vacuum, load-lock chamber 92 also includes vacuum pump connection 100 to pumping package 88. Additionally, scatter module 102 may be included in load-lock chamber 92 for determining the surface roughness and reflectance of semiconductor wafer 38 for wafer processing measurements according to U.S.

patent application Ser. No. 07/638472, now U.S. Pat. No. 5,239,216.

Process control computer 104 checks the status of multi-zone illuminator 84 for diagnosis/prognosis purposes and provides multiple temperature control signals to PID controller 106 in response to temperature readings of multi-point sensors. The multi-zone controller (or PID controller) receives measured multi-point temperature sensor outputs as well as the desired wafer temperature set point (from process control computer 104) and delivers suitable power set points to the lamp power supply module 108. Signal lines 110 between process control computer 104 and multi-zone illuminator 84 include signals from multi-point temperature sensors for real-time semiconductor wafer 38 temperature measurements and lamp power readings.

FIG. 4 shows a perspective view of the multi-processing reactor 50 described in FIG. 3. Reactor casing 56 surrounds process chamber wall 58 within which process chamber 72 (not shown) establishes the semiconductor wafer 36 fabrication environment. The reactor casing 56 rigidly supports multi-zone lamp module 84 which includes chuck 82 of the preferred embodiment. Adjacent to reactor chamber 56 is vacuum load-lock chamber 92 within which appears cassette 96 for holding semiconductor wafers 38. Adjacent to vacuum load-lock chamber 92 is process control computer 104 which controls the operation of the various elements associated with processing reactor 50.

Figure 5:
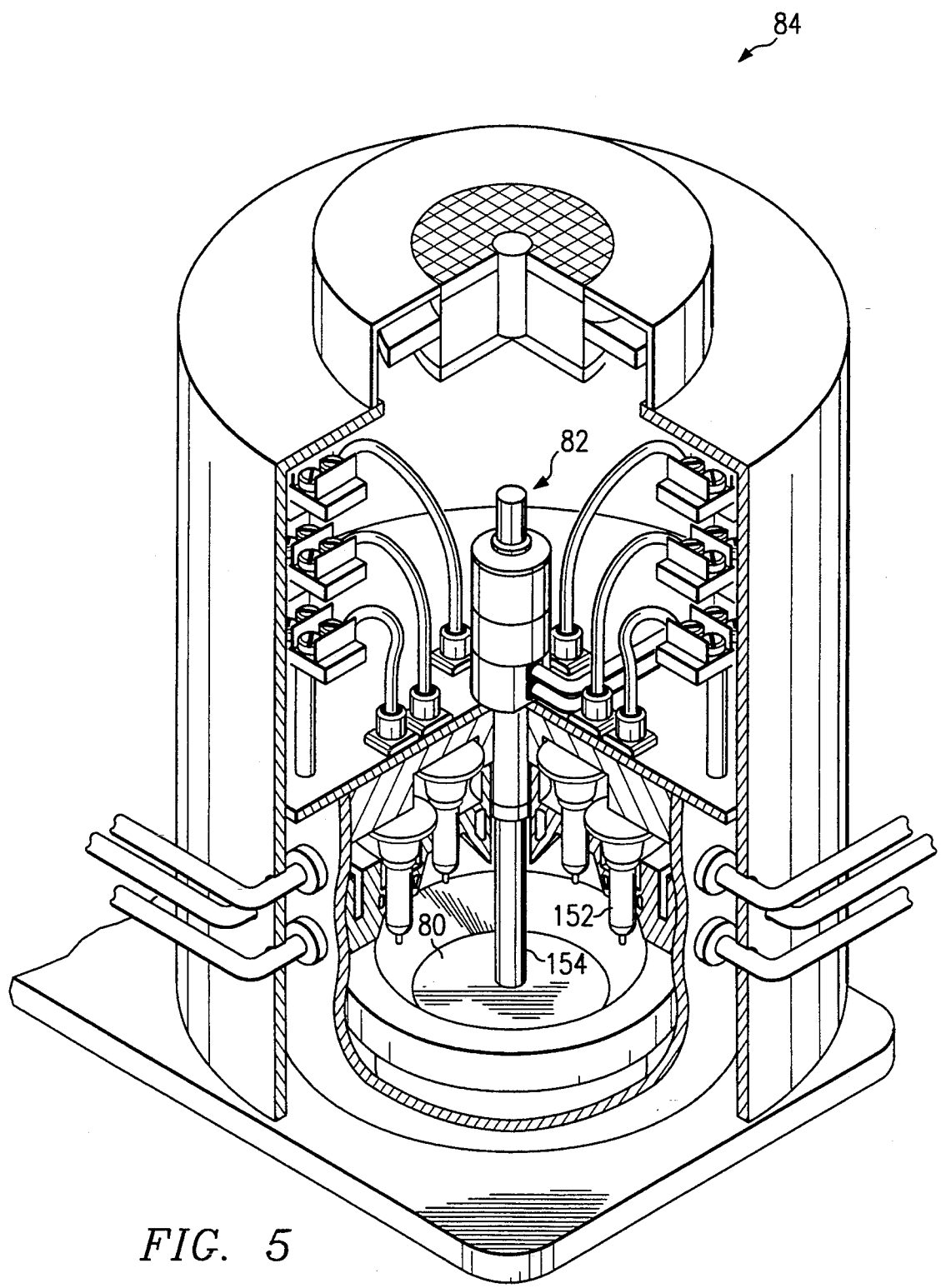
FIG. 5 is a perspective view of a multi-zone illuminator module incorporating the preferred embodiment.
Figure 6A:
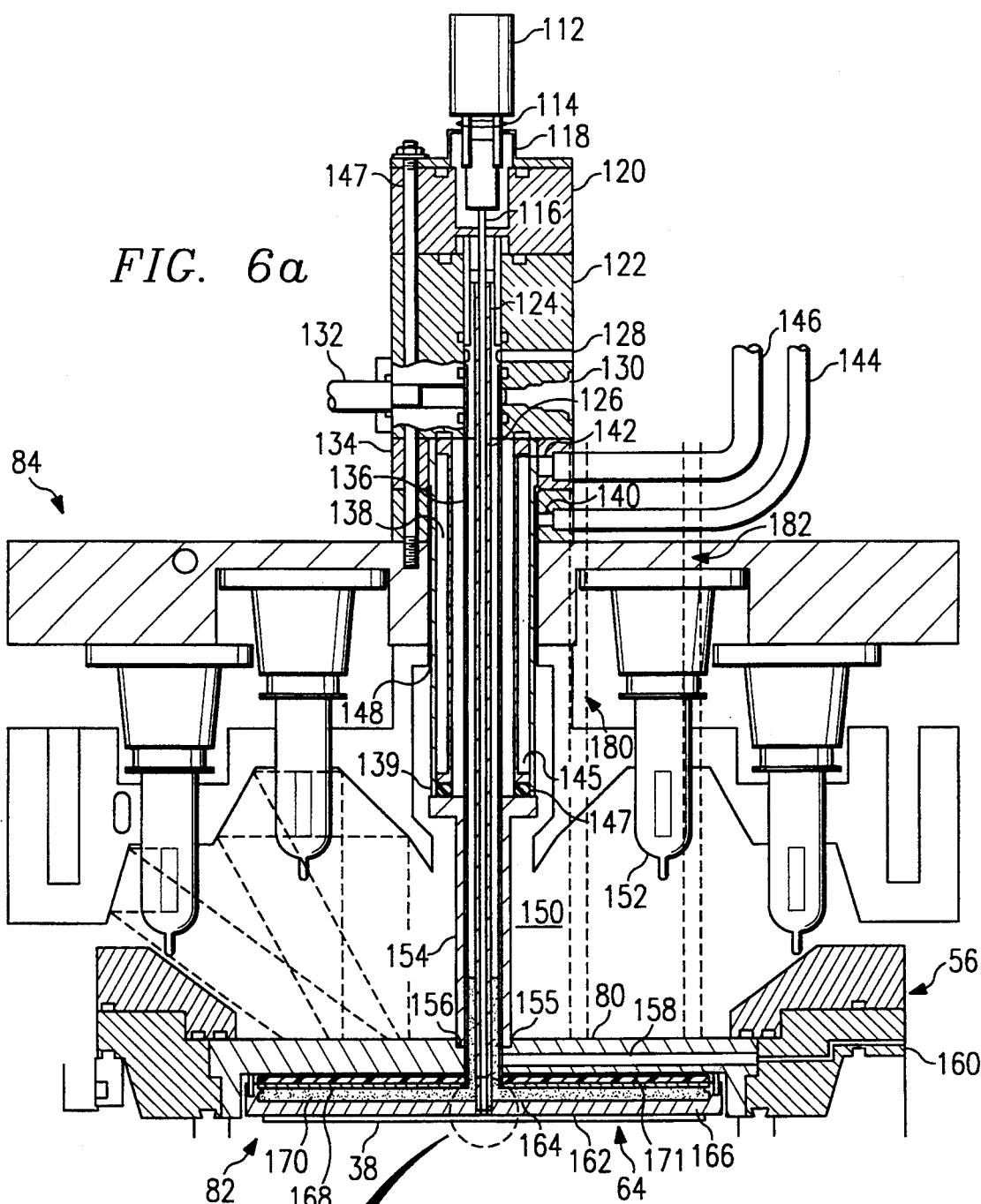
FIGS. 6a and 6b are cut-away side schematic views of the illuminator module of FIG. 5 along with the lamp-heated chuck of the preferred embodiment.
Figure 6B:
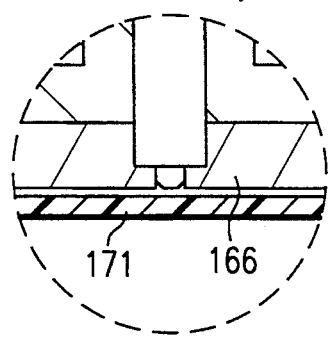

FIG. 5 illustrates a partially cut-away prospective view of a three-zone version of a multi-zone illuminator module 84 which supports and heats chuck 82 of the present invention. Moreover, FIGS. 6a and 6b show a side schematic view of chuck 82 associated with illuminator module 84 and quartz window 80 associated with reactor casing 56. U.S. patent application Ser. No. 07/690,426 describes illuminator module 84 in detail. That description is expressly incorporated by reference to the same extent as if herein written. Appropriate modifications of illuminator module 84 may, however, be necessary to properly house and support chuck 82. These modifications are well within the scope of the present invention.

Referring in particular to chuck 82 of FIG. 6a, thermocouple adaptor 112 connects to thermocouple feed-throughs 114 which connect to spring-loaded thermocouple 116. Thermocouple adaptor 112 attaches at mount 118 to insulating thermocouple adaptor 120 (made of teflon or another material). Thermocouple adapter 120 mounts to insulating adaptor 122 which receives thermocouple/helium tube 124 and tin melt tube 126. Within adaptor 122 are helium inlet 128 to heat thermocouple/helium tube 124 and tin powder connection 130 to tin melt tube 126.

In the preferred embodiment, thermocouple/helium tube 124 has an outside diameter of approximately 3/16 inch for helium flow and contains spring-loaded thermocouple 116. Additionally, RF connection pin 132 connects to tin melt tube 126. Adaptor 122 mounts to insulating adaptor 134 which receives teflon tube 136, tin melt tube 126, and thermocouple/helium tube 124. Surrounding teflon tube 136 and tin melt tube 126 appears stainless steel or aluminum tube 138 for receiving and circulating cooling water from cooling water inlet 140 through cooling channel 145 back to cooling water outlet (not shown) respectively. Cooling water from cooling water channel 145 provides sufficient cooling for the vacuum O-ring seal 147 between quartz tube 154 and the wafer-cooled stainless steel tube 138. Connecting insulating adaptors 120, 122, and 134 are tie bolts 147. Between the inner surface of illuminator module 84 and the outer surface of water-cooled stainless steel tube 138 appears air gap 148 which permits a cooling air flow into space 150 between lamps 152 and quartz window 80. The air flow is provided via connection tube 144. The air flow cools quartz window 80 and lamps 152.

Figure 7:
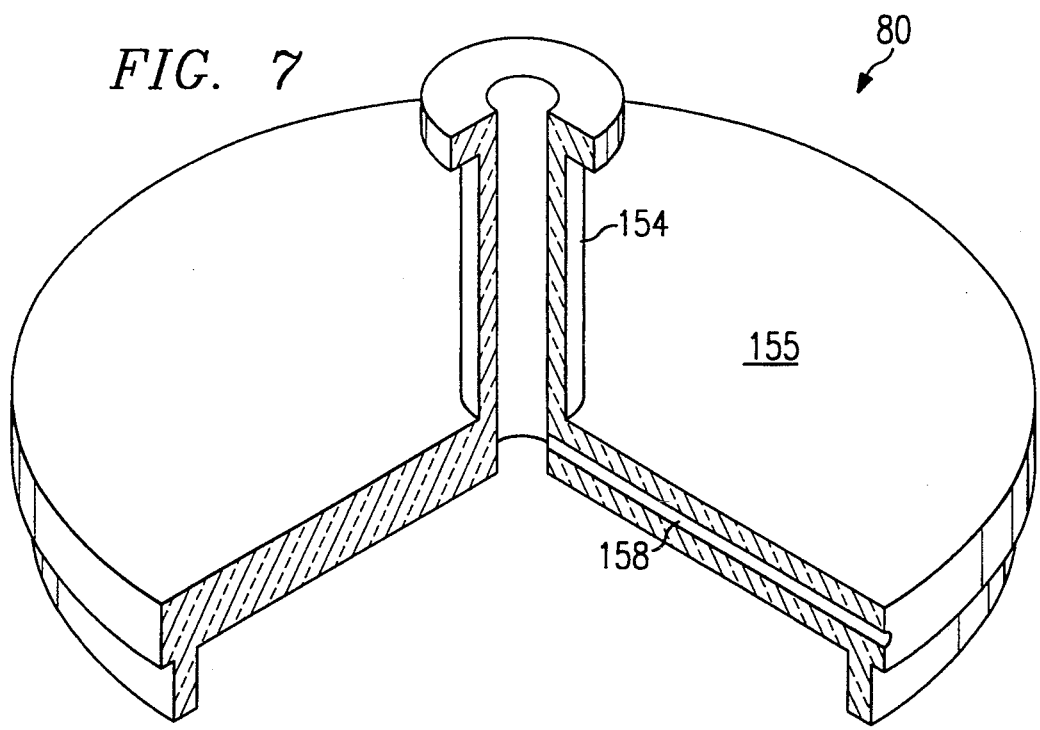
FIG. 7 is a cross-sectional view of the modified quartz window for a fabrication reactor used in conjunction with the preferred embodiment of the present invention.

For the preferred embodiment, quartz window 80 has been modified to include quartz tube 154 which supports teflon tube 136 and receives tin melt tube 126 and thermocouple/helium tube 124. (FIG. 7 shows the quartz window 80 modification for the preferred embodiment.) In FIG. 6a, quartz tube 154 is fused to quartz window base 155 and permits passage of tin melt tube 126 and thermocouple/helium tube 124 through aperture 156. Sleeve 154 joins teflon tube 136 at vacuum sealed interface 139. Quartz window 80 also includes inert gas flow channel 158 which receives inert gas through channel 160 of reactor casing 56. Channel 158 in quartz window 80 allows an inert gas (e.g., Ar, He or a process diluent such as $H_2$ or $N_2$) between quartz window 80 and the top portion of chuck 82 which may be silicon carbide disk 171 or simply a black anodized surface on chuck top surface. The inert gas purge maintains a clean quartz window surface in the gap 175 region. Thermocouple/helium tube 124 and tin melt tube 126 join to chuck base 162 which includes tin chamber 164 surrounded by cladding 166. Adjoining cladding 166 some small distance from quartz window 80 is silicon carbide or silicon or sand-blasted quartz disk 171. Within tin melt chamber 164 appears a tin medium 170 which, when heated to process temperatures of fabrication reactor 50 forms a liquid to promote conductive heat flow from the surface of silicon carbide disk 168 as well as radially between the center and edge regions. Clamped to the bottom surface of cladding 166 is semiconductor wafer 38.

Referring to FIGS. 6a and 6b, thermocouple tip 171 is spring-loaded by spring-loaded thermocouple mechanism 118 within an adaptor 120 to sense the temperature of cladding 166. FIG. 6b shows that thermocouple tip 171 may either be designed to contact semiconductor wafer 38 backside or simply make thermally conductive contact with cladding 166 for determining semiconductor wafer 38 temperature.

Figure 8:
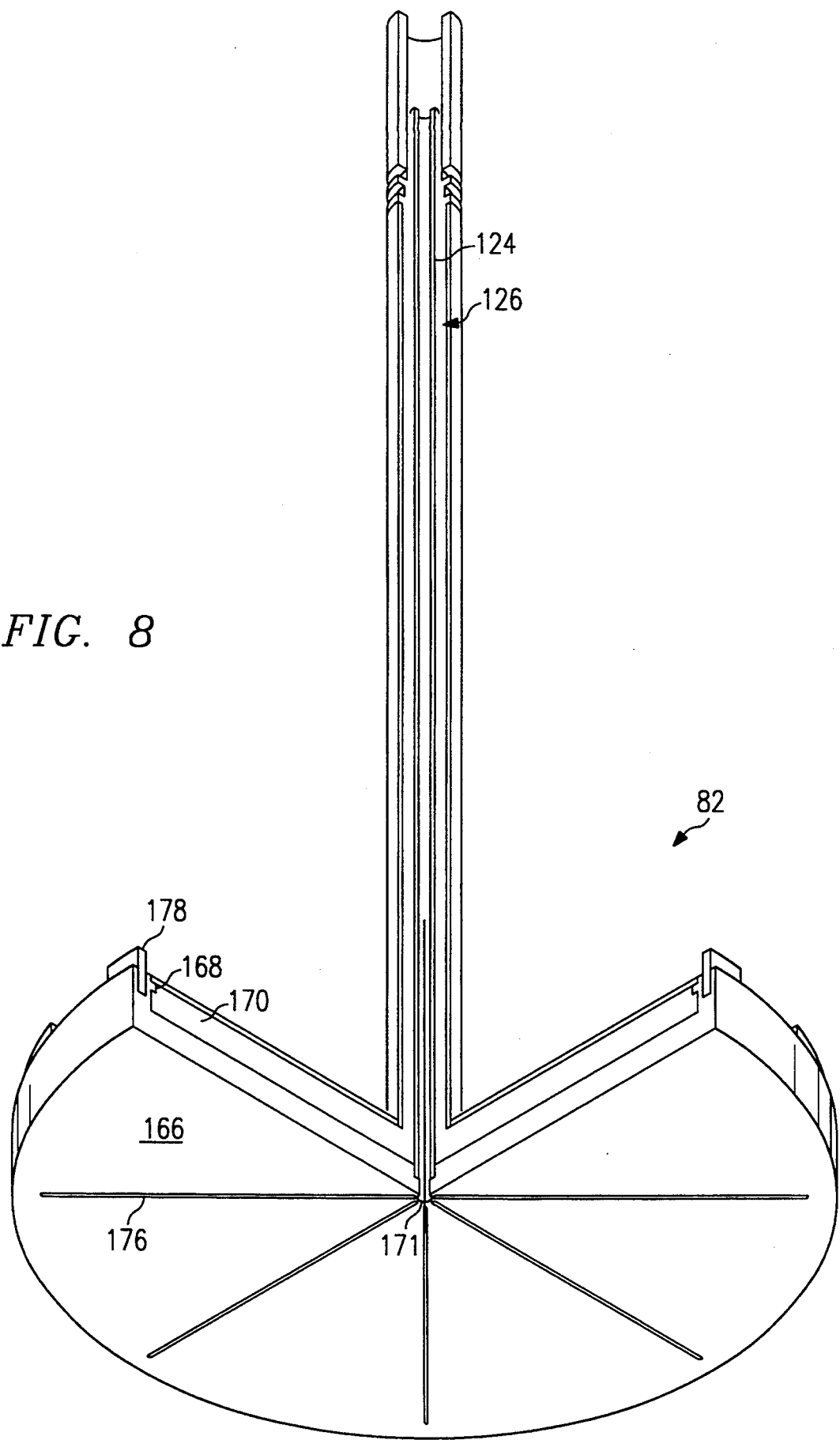
FIG. 8 is a cross-sectional schematic view of the preferred embodiment of the base of the chuck.

FIG. 8 shows an isometric view of the preferred embodiment of chuck 82. Base 64 includes radially oriented channels 176 from center hole 174 through which helium flows to purge the back of semiconductor wafer 38. In the preferred embodiment, a central hole 174 approximately inch in diameter is used for both the thermocouple connection and for helium (or argon) purge gas flow to the back of semiconductor wafer 38. The bottom cladding 166 of chuck 82 of the preferred embodiment comprises a 316 L stainless steel which is nickel plated or aluminum which is ⅛ of an inch thick. Other metallic materials or alloys may also be used.

Silicon carbide disk 171 (see FIG. 9) is separated from quartz window 80 by gap 182 that is approximately ⅛ of an inch and attaches to chuck cladding 168. Gap 175 eliminates conductive heat transfer to quartz window 80 and makes the effective thermal mass of chuck 82 small. In essence, gap 175 thermally decouples chuck 82 from the thermal mass of the rest of fabrication reactor 50. This also permits an inert gas to flow through reactor casing channel 160 into channel 158 down around tin melt tube 126 and through the gap separating silicon carbide disk 171 from quartz window 80. Since quartz window 80 stays at a much lower temperature than chuck 82, it is much easier to cool down the vacuum O-rings that separate quartz window 80 from the remaining portions of chuck 82.

Silicon carbide or graphite disk 171 has an absorbing surface and is approximately 1/16 of an inch thick. To separate silicon carbide or graphite disk 171 from quartz window 80, the preferred embodiment uses pins 178 to provide the gap 175 for purge. Within tin melt chamber 164, tin medium 170 not only fills the chamber, but also fills up to level 180 for full conduction of thermal energy for wafer heating. For this purpose, a silicon carbide coated outer tube (not shown) may be placed around tin melt tube 124 to absorb optical energy from lamps 152 and fully liquify or melt all of tin medium 170.

The preferred embodiment of chuck 82 may be formed of aluminum for applications with temperatures less than approximately 500° C. Silicon carbide disk 171 may be eliminated if a black anodized aluminum surface is used to absorb optical energy from heating lamps 152 of illuminator module 84. For applications needing temperatures as high as approximately 850° C., chuck 82 may be formed of nickel-plated stainless steel such as 316 L stainless steel or monel. Tin melt medium 170 is used to achieve temperature uniformity over the chuck surface. This provides a medium in which small heat conducting fluid currents exist at elevated temperatures to uniformly distribute thermal energy within chuck base 162.

Chuck 82 may also be used, depending on its material, in high temperature semiconductor device fabrication processes ranging from 300° to 1100° C. If chuck 82 is made of aluminum, the top plate of base 162 may be hard black anodized for efficient absorption of lamp energy. There is no need for the silicon carbide disk if the chuck is made of aluminum with black anodized surface.

Figure 9:
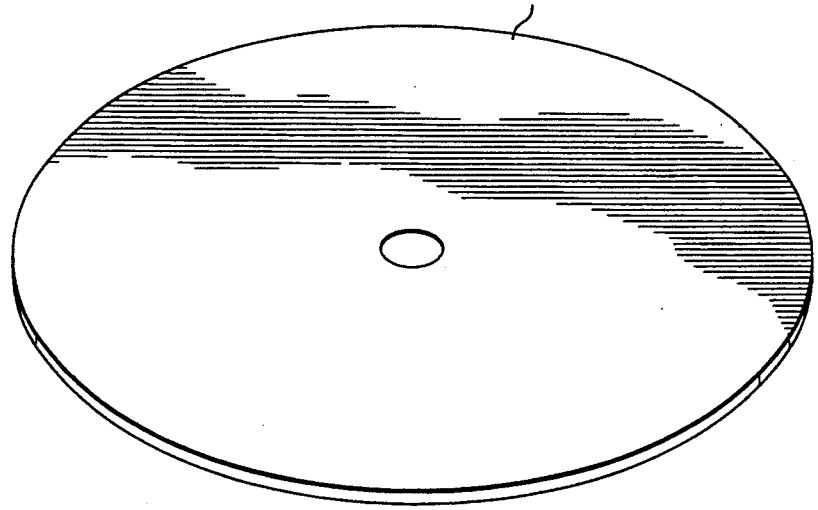
FIG. 9 is an isometric view of a silicon carbide or graphite or silicon disk used for light absorption in conjunction with the preferred embodiment.

If desired, chuck 82 may operate without tin in the tin melt container 170. FIG. 9 shows this alternative embodiment. In this mode of operation, the two or three heating zones in the modified illuminator may be used to optimize the wafer heating uniformity.

Teflon cylinder (or another insulating material) is properly machined to make the end seals for the metallic tubes, to insulate the RF hot portion of the chuck from the helium or vacuum pump connections, or to provide RF connections and provide an RF-insulated thermocouple feedthrough. The entire chuck thickness including the quartz window can be made approximately 1.25 inches.

Chuck 82 may also be used with a multi-zone heat lamp. U.S. patent application Ser. No. 07/690,426 describes both a three-zone and four-zone illuminator module 84. In either case, the center light pipe of that module may be used to receive the feedthrough to RF chuck 82. Through this connection, a radio-frequency power may be transmitted into the chuck base 162 for RF plasma generation.

When used with illuminator module 82, silicon carbide or graphite disk 171 may be used to determine the temperature of semiconductor wafer 38. Referring to FIG. 6a, illuminator module 84 is designed to contain light pipes 182 and 180. Within light pipes 182 and 180 may be housed pyrometry sensors for performing pyrometry measurements on silicon carbide or graphite disk 171. The emissivity of silicon carbide graphite disk 171 may be measured and treated as a known constant value. As different semiconductor wafers 38 are placed on chuck surface 162 the temperature of the chuck 82, semiconductor wafer 38, and silicon carbide or graphite disk 168 may be determined to vary by known amounts.

Since the emissivity of the silicon carbide or graphite disk 171 is known, pyrometry measurements of silicon carbide or graphite disk 171 will result in an accurate temperature measurement of silicon carbide or graphite disk 171. Since a known temperature difference between semiconductor wafer 38 and silicon carbide or graphite disk 171 may be determined, pyrometry temperature measurements of silicon carbide or graphite disk 171 may provide a reliable measure of the semiconductor wafer 38 temperature. These temperature measurements will not significantly depend on the emissivity of semiconductor wafer 38 and, therefore, will provide a more accurate measure of the temperature of semiconductor wafer 38. Additionally, even when silicon carbide disk 171 is not used, a black anodized top surface of chuck will permit the same type of measurement for determining semiconductor wafer 38 temperature by way of pyrometry measurements of chuck top surface temperature. These temperature measurements may be particularly valuable during steady-state operations and may have further use during transient operations.

The RF contact feeds from RF contact 132 into tin melt tube 126 to provide a radio-frequency power that may travel to melt tube 126 and into chuck base 162. The frequency for the RF plasma generating source may range between 100 KHz and 13.5 MHz and permits the formation of RF plasma in the proximity of semiconductor wafer 38. As a result, not only may chuck 82 provide a heated surface for thermal processing of semiconductor wafer 38, but also it may serve as a source of RF frequency for local RF plasma generation from activated species for plasma-enhanced deposition and etching or cleaning processes.

In summary, this invention has described a new lamp-heated radio-frequency chuck for uniform wafer processing that not only provides uniform temperature distribution across the surface of semiconductor wafer 38, but also is designed to cooperate with illuminator module 84. The radio-frequency chuck is designed to permit clean semiconductor wafer processing by providing thermal and plasma energy sources. A purge gas flow between the chuck and optical/vacuum quartz window prevents formation of any deposits the window or absorbing surface. Moreover, chuck 82 permits the transmission of a radio-frequency power into semiconductor device fabrication reactor process chamber for local generation of radio-frequency plasma. Chuck 82 is thermally decoupled from the larger thermal mass of the fabrication reactor casing 56 to increase its process temperature control flexibility and reactor reliability. Moreover, in the preferred embodiment chuck 82 includes a tin melt chamber 164 that includes a tin medium which forms a liquid during semiconductor wafer 38 thermal processing. The liquid tin further promotes uniform temperature distribution for uniform wafer processing.

Although the preferred embodiment has been described in detail, it should be understood that various changes, substitutions, and alterations may be made herein without departing from the spirit and scope of the invention as defined in the appended claims.

What is claimed is:

1. A single-wafer rapid thermal processing/plasma multiprocessing reactor comprising:
   a process chamber;
   a plurality of heating lamps operable to form multiple heating zones within said chamber;
   means for placing plasma in and removing plasma from said process chamber; and
   a radio-frequency plasma chuck within said chamber, but thermally decoupled from the mass of the reactor, including an absorbing surface positioned to absorb optical energy from said heating lamps and to transform said optical energy into radiant energy, a thermal mass in association with said absorbing surface and being capable of distributing said radiant heat energy, and a circular contact surface in association with said thermal mass capable of transferring to an associated semiconductor wafer said distributed radiant heat energy, said thermal mass including a circular heat distribution chamber centrally connected to a tubular extension thereof and containing a metallic substance that transforms into a liquid substance at a suitable operating temperature.

2. A reactor as recited in claim 1 wherein said absorbing surface comprises a light absorbing silicon carbide plate capable of receiving said optical energy and directing said radiant heat energy into said thermal mass.

3. A reactor as recited in claim 1 wherein said chuck further includes a plurality of pins to maintain an air gap between said thermal mass and said reactor so as to thermally isolate said thermal mass from said reactor.

4. A rector as recited in claim 1 comprising a quartz window through which said chuck can receive optical energy, and a purge gas flow channel through which fabrication gases can be purged from between said quartz window and said absorbing surface during operation of said reactor.

5. A reactor as recited in claim 1 which further comprises a radio frequency source, said source being operable to direct radio-frequency electromagnetic power to said thermal mass so that said thermal mass radiates said electromagnetic energy proximate said thermal mass for plasma generation.

* * * * *